(12) United States Patent
El-Damak et al.

(10) Patent No.: US 9,726,697 B2
(45) Date of Patent: Aug. 8, 2017

(54) COUPLED INDUCTOR CURRENT SENSING APPARATUS AND SYSTEMS

(71) Applicant: TEXAS INSTRUMENTS INCORPORATED, Dallas, TX (US)

(72) Inventors: Dina Reda El-Damak, Cambridge, MA (US); Jeffrey Morroni, Highlands Ranch, CO (US); Steven Mark Mercer, Livermore, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 235 days.

(21) Appl. No.: 14/588,394

(22) Filed: Dec. 31, 2014

(65) Prior Publication Data

US 2016/0187386 A1 Jun. 30, 2016

(51) Int. Cl.
*G01R 1/20* (2006.01)
*G01R 19/10* (2006.01)
*G01R 19/00* (2006.01)
*G01R 31/40* (2014.01)

(52) U.S. Cl.
CPC ......... *G01R 19/10* (2013.01); *G01R 19/0092* (2013.01); *G01R 1/203* (2013.01); *G01R 31/40* (2013.01)

(58) Field of Classification Search
CPC .................................. G01R 15/18; G01R 1/203
USPC ........ 324/125, 76.52, 76.75, 76.77; 323/282, 323/285, 287, 351
See application file for complete search history.

(56) References Cited

U.S. PATENT DOCUMENTS

| 6,469,481 | B1 | 10/2002 | Tateishi | |
|---|---|---|---|---|
| 8,072,200 | B1* | 12/2011 | Qiu | G01R 19/0092 323/282 |
| 8,917,077 | B2* | 12/2014 | Lin | G05F 1/10 323/271 |
| 2009/0201001 | A1* | 8/2009 | Chellamuthu | H02M 3/157 323/282 |
| 2009/0206810 | A1* | 8/2009 | Chellamuthu | H02M 3/156 323/282 |
| 2009/0237051 | A1* | 9/2009 | Saitoh | H02M 3/156 323/282 |
| 2013/0162171 | A1* | 6/2013 | Ishii | G05F 1/618 315/291 |

* cited by examiner

*Primary Examiner* — Giovanni Astacio-Oquendo
(74) *Attorney, Agent, or Firm* — Michael A. Davis, Jr.; Charles A. Brill; Frank D. Cimino

(57) ABSTRACT

A voltage proportional to a sum of currents flowing though first and second coupled inductors is developed across a first capacitor common to first and second series RC networks if the RC networks are time constant-matched to the inductors. The first and second inductors are coupled between a first and second switched drive phase input terminal, respectively, and an apparatus output terminal. The first and second RC networks are coupled in parallel with the first and second inductor, respectively. Inverting and non-inverting inputs of an amplifier are coupled to junctions of third and fourth time constant-matched series RC networks coupled in parallel with the first and second inductors, respectively. The amplifier subtracts voltages sensed at the junctions to generate a difference signal proportional to a magnitude difference of the currents flowing through the inductors.

19 Claims, 5 Drawing Sheets

COUPLED INDUCTOR CURRENT SENSING APPARATUS AND SYSTEMS

TECHNICAL FIELD

Embodiments described herein relate to apparatus and systems associated with direct current voltage conversion, including coupled inductor current sensing.

BACKGROUND INFORMATION

Electronic circuits of various applications may include multiple inductors other than transformers sharing a single core. Using a common core may be employed for space and cost saving purposes rather than for the explicit purpose of coupling energy from one shared-core inductor to another. In fact, field coupling between shared-core inductors may yield undesirable consequences. For example, such coupling may complicate the sensing of current flowing through each of two shared-core inductors in a direct current ("DC")-to-DC converter such as a multiphase buck converter.

FIG. 1A is a prior-art schematic diagram of a two-phase DC-DC converter output section including time constant matched current sensing circuits 105 and 108 associated with each of the uncoupled output inductors L1 110 and L2 120, respectively. The technique of sensing/measuring instantaneous current flow through an uncoupled inductor is described by Tateishi in U.S. Pat. No. 6,469,481, the latter incorporated herein by reference in its entirety. The terms "sensing" and "measuring" are used synonymously herein and mean obtaining a voltage analogue waveform that is instantaneously proportional to inductor current, whether or not magnitudes of particular points of the voltage waveform are reduced to numerical values.

Each current sensing circuit includes a series coupled sense resistor (e.g., the sense resistors R1 125 and R2 130 corresponding to the sensing circuits 105 and 108, respectively) and sense capacitor (e.g., the sense capacitors C1 135 and C2 140 corresponding to the sensing circuits 105 and 108, respectively). Each such series coupled RC sense network is coupled in parallel with a series combination of the corresponding inductor and a resistor representing the inductor's parasitic DC resistance ("DCR") (e.g., DCR1 145 and DCR2 150 corresponding to the inductors L1 110 and L2 120, respectively). The time constant of each inductor is equal to the inductance L of the inductor divided by the DCR of the inductor. The time constant of each RC sense network is the resistance R of the sense resistor multiplied by the capacitance C of the sense capacitor. The inductor time constant L/DCR is matched to the sense network time constant RC if L/DCR=R*C.

FIG. 1B is a prior-art waveform diagram illustrating an example inductor current 165B. FIG. 1B also illustrates a corresponding time constant matched voltage analogue 160B of the inductor current 165B. The sense voltage 160A and 160B are accurate representations of the current 165A and 165B flowing through the inductor L1 110 if time constant matching is adhered to.

Accordingly, the sense resistor and capacitor (e.g., the sense resistor R1 125 and the sense capacitor C1 135) are chosen such that their time constant RC is equal to the corresponding inductor time constant (e.g., the inductance of L1 110 divided by the resistance of DCR1 145). So chosen, the voltage V_C1 160A and 160B seen across the sense capacitor C1 135 is instantaneously proportional to the current I1 165A and 165B flowing through the inductor L1 110. Likewise, the voltage V_C2 170 seen across the sense capacitor C2 140 is instantaneously proportional to the current I2 170 flowing through the inductor L2 120.

However, the simple time constant matched current sensing circuits 105 and 108 become considerably more complex if the inductors L1 110 and L2 120 are magnetically flux-coupled. Although such coupled inductor current sensing circuits are known, they suffer variously from high complexity and consequent large surface area requirements, difficulty in tuning for wide ranges of inductances and coupling coefficients, inaccuracy in the use for phase balancing due to offset and gain errors associated with cascaded amplifiers, and/or high quiescent current consumption when used in high switching speed applications.

SUMMARY OF THE INVENTION

A voltage proportional to a sum of currents flowing though first and second coupled inductors is developed across a first capacitor common to first and second series RC networks if the RC networks are time constant-matched to the inductors. The first and second inductors are coupled between a first and second switched drive phase input terminal, respectively, and an apparatus output terminal. The first and second RC networks are coupled in parallel with the first and second inductor, respectively. Inverting and non-inverting inputs of an amplifier are coupled to junctions of third and fourth time constant-matched series RC networks coupled in parallel with the first and second inductors, respectively. The amplifier subtracts voltages sensed at the junctions to generate a difference signal proportional to a magnitude difference of the currents flowing through the inductors.

DETAILED DESCRIPTION

Figure 1A:
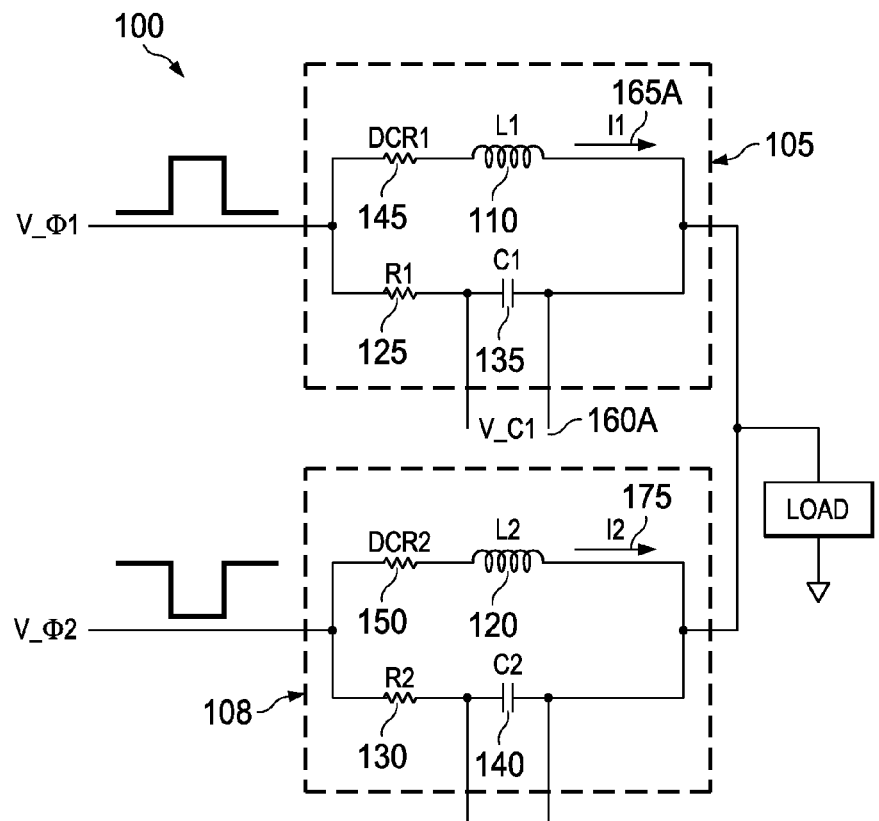
FIG. 1A is a prior-art schematic diagram of a two-phase DC-DC converter output section including a time constant matched current sensing circuit associated with each uncoupled output inductor.
Figure 1B:
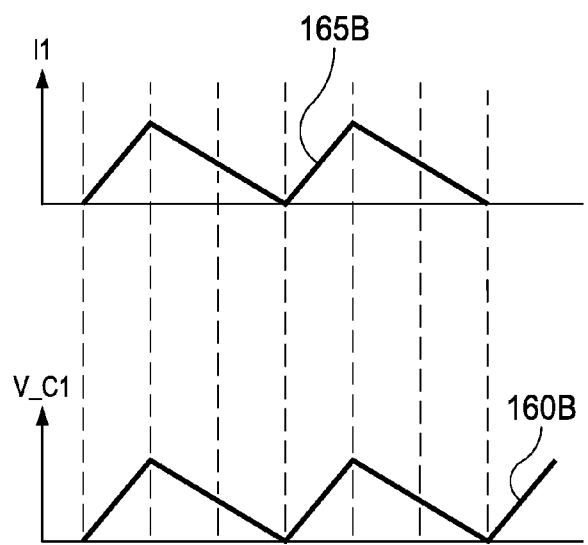
FIG. 1B is a prior-art waveform diagram illustrating an example inductor current and a corresponding time constant matched voltage analogue of the inductor current.
Figure 2:
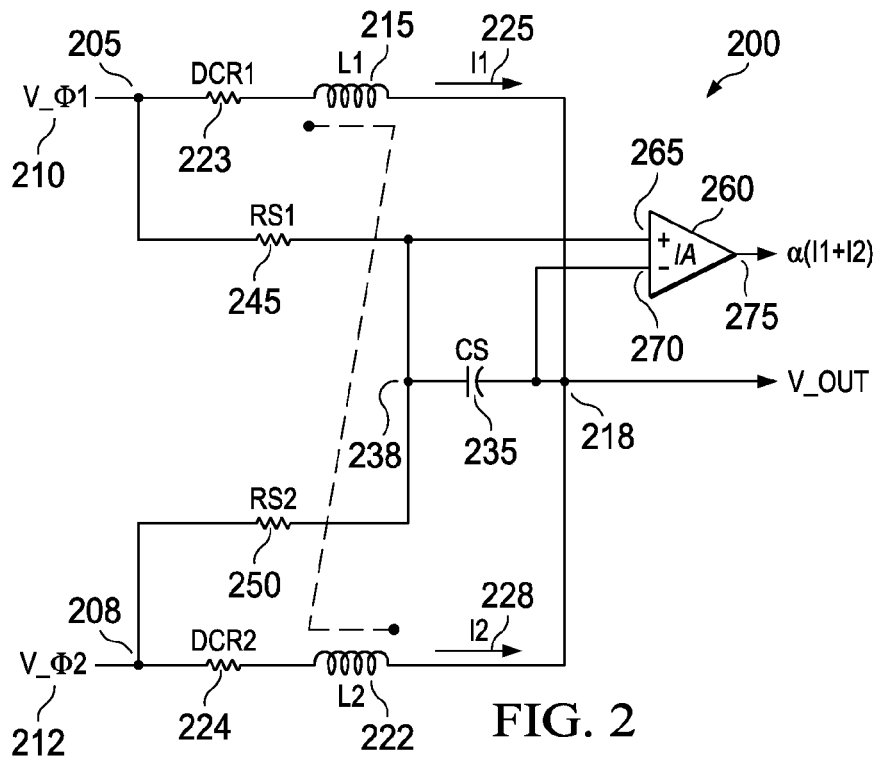
FIG. 2 is a schematic diagram of a coupled inductor current sensing apparatus according to various example embodiments.

FIG. 2 is a schematic diagram of a coupled inductor current sensing apparatus 200 according to various example embodiments. The apparatus 200 includes two switched voltage input terminals 205 and 208. Each of the input terminals 205 and 208 is coupled to a multiphase drive voltage source (not shown). The multiphase voltage source may be associated with a DC-to-DC power converter but need not be.

The apparatus 200 receives a switched drive voltage ("drive phase") 210 at the input terminal 205 and a drive phase 212 at the input terminal 208. Waveforms representing the drive phases 210 and 212 are substantially rectangular-shaped. A phase difference between the drive phases 210 and 212 is typically 180 degrees but need not be. The drive phases 210 and 212 are typically duty cycle controlled and/or amplitude modulated by the multiphase drive voltage source in order to control a voltage level at an output terminal 218 of the apparatus 200.

An inductor L1 215 is coupled between the input terminal 205 and the apparatus output terminal 218. An inductor L2 222 is coupled between the input terminal 208 and the apparatus output terminal 218. The inductance values of the inductors 215 and 222 are substantially equal. Parasitic DC resistance associated with the inductors 215 and 222 is modeled as resistors DCR1 223 and DCR2 224, respectively. However it is noted that the resistors 223 and 224 are not discrete resistors but are merely representative of the parasitic DC resistance of each of the inductors 215 and 222, respectively. The resistances 223 and 224 are substantially equal.

It is noted that some embodiments of the apparatus 200 as well as apparatus and systems described below may be implemented using discrete components. Other embodiments are implemented in silicon as integrated circuits ("ICs") or as portions of IC-based systems. For example, some embodiments of coupled inductor current sum and/or difference sensing circuits may be included as sub-sections of a DC-DC voltage converter IC. Some components of a current sum and/or difference circuit or an array thereof implanted in silicon may include discrete components that are impractical or inconvenient to implement on-chip. In particular, the current-carrying inductors 215 and 222 may be included as components of some embodiments of the apparatus 200, particularly embodiments implemented with discrete components. However, some embodiments of the apparatus 200, including IC-implemented embodiments, do not include the inductors 215 and 222 as components but include terminals to connect to external versions of the inductors 215 and 222. In the latter case the apparatus 200 senses inductor currents I1 225 and I2 228 but does not conduct the inductor currents 225 and 228 within the apparatus 200.

The apparatus 200 includes a current sum sense capacitor CS 235. The sum sense capacitor 235 is coupled between a summing node 238 and the apparatus output terminal 218. A sum sense voltage proportional to an instantaneous sum of the currents I1 215 and I2 218 flowing through the two mutually coupled inductors 225 and 228 is developed across the sum sense capacitor 235. The sum sense voltage is equal to the DCR resistance 223/224 divide by two multiplied by the sum of the magnitudes of the currents I1 225 and I2 228:

$V\_CS=DCR/2*(I1+I2)$

The apparatus 200 also includes a first current sum sense resistor RS1 245 coupled between the first switched voltage input terminal 205 and the summing node 238. The apparatus 200 further includes a second current sum sense resistor RS2 250 coupled between the second switched voltage input terminal 208 and the summing node 238. Resistance values of the resistors 245 and 250 are substantially equal. The sum sense voltage results from voltage drops across the first and second current sum sense resistors 245 and 250. The voltage drops correspond to charging currents flowing through the sum sense resistors 245 and 250 and into or out of the current sum sense capacitor 235 as the first and second drive phases 210 and 212 are switched on and off.

The apparatus 200 also includes a current sum amplifier 260 coupled to the sum sense capacitor 235. The sum amplifier 260 may be implemented with an operational amplifier, a transconductance amplifier or a sense amplifier, for example. Non-inverting and inverting input terminals 265 and 270 are coupled across the current sum sense capacitor 235. The current sum amplifier 260 senses the sum sense voltage across the sum sense capacitor 235 and generates a sum signal α(I1+I2) at an output terminal 275 of the sum amplifier 260. The sum signal α(I1+I2) is proportional to the instantaneous sum of the magnitudes of the currents I1 225 and I2 228 flowing through the two mutually coupled inductors L1 215 and L2 222, respectively:

$\alpha(I1+I2)=DCR/2*(I1+I2)*(\text{gain of the sum amp 260})$

Figure 3:
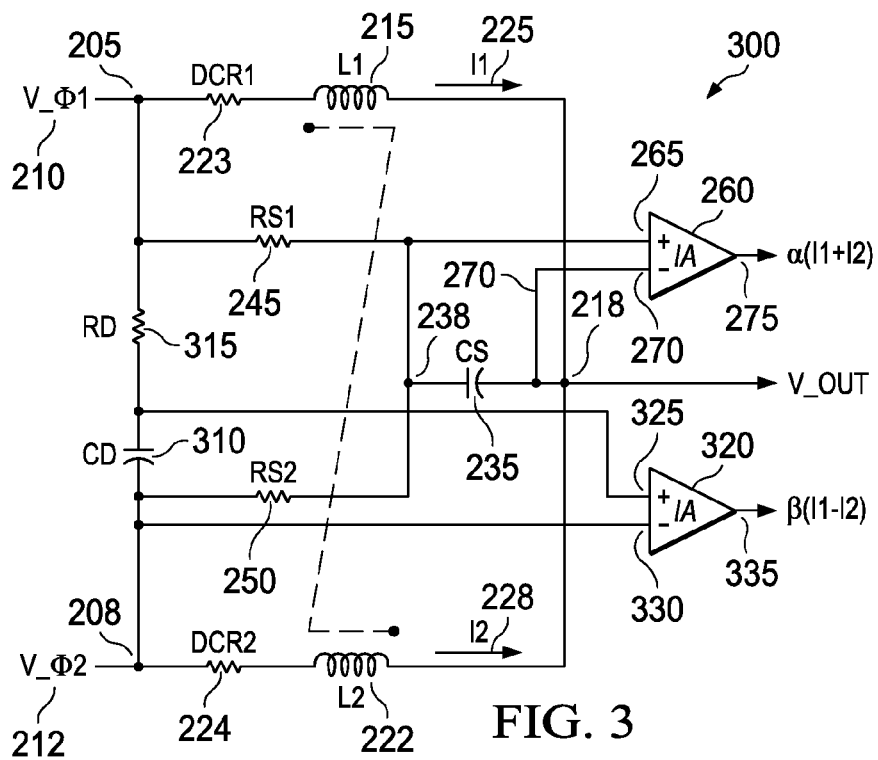
FIG. 3 is a schematic diagram of a coupled inductor current sensing apparatus according to various example embodiments.

FIG. 3 is a schematic diagram of a coupled inductor current sensing apparatus 300 according to various example embodiments. The apparatus 300 includes the two switched voltage input terminals 205 and 208, the switched drive phases 210 and 212, the output terminal 218, the inductors L1 215 and L2 222, the inductor currents I1 225 and I2 228, the current sum sense capacitor 235, the summing node 238, the current sum sense resistors RS1 245 and RS2 250 and the current sum amplifier 260, all as previously described with reference to the apparatus 200 of FIG. 2.

The apparatus 300 further includes a current difference sense capacitor CD 310 and a current difference sense resistor RD 315. The capacitor 310 and the resistor 315 are coupled in series to form a current difference resistor-capacitor ("RC") network. The current difference RC network is coupled between the first and second input terminals 210 and 212.

A difference sense voltage is developed across the difference sense capacitor 310. The difference sense voltage is proportional to an instantaneous difference between magnitudes of the currents I1 225 and I2 228 flowing through the two mutually coupled inductors L1 215 and L2 222, respectively. The difference sense voltage results from a voltage drop across the current difference sense resistor 315. The voltage drop corresponds to a charging current flowing through the current difference sense resistor 315 and into/out of the difference sense capacitor 310 as the first and second drive phases 210 and 212 are switched.

The coupled inductor current sensing apparatus 300 also includes a current difference amplifier 320. Non-inverting and inverting input terminals 325 and 330 of the current difference amplifier 320 are coupled across the difference sense capacitor 310. The current difference amplifier 320 senses the current difference sense voltage and generates a difference signal β(I1−I2) at an output terminal 335. The difference signal β(I1−I2) is proportional to the instantaneous difference between the magnitudes of the currents 225 and 228 flowing through the two mutually coupled inductors L1 215 and L2 222.

$\beta(I1-I2)=DCR*(I1-I2)*(\text{difference amp gain})$

Figure 4:
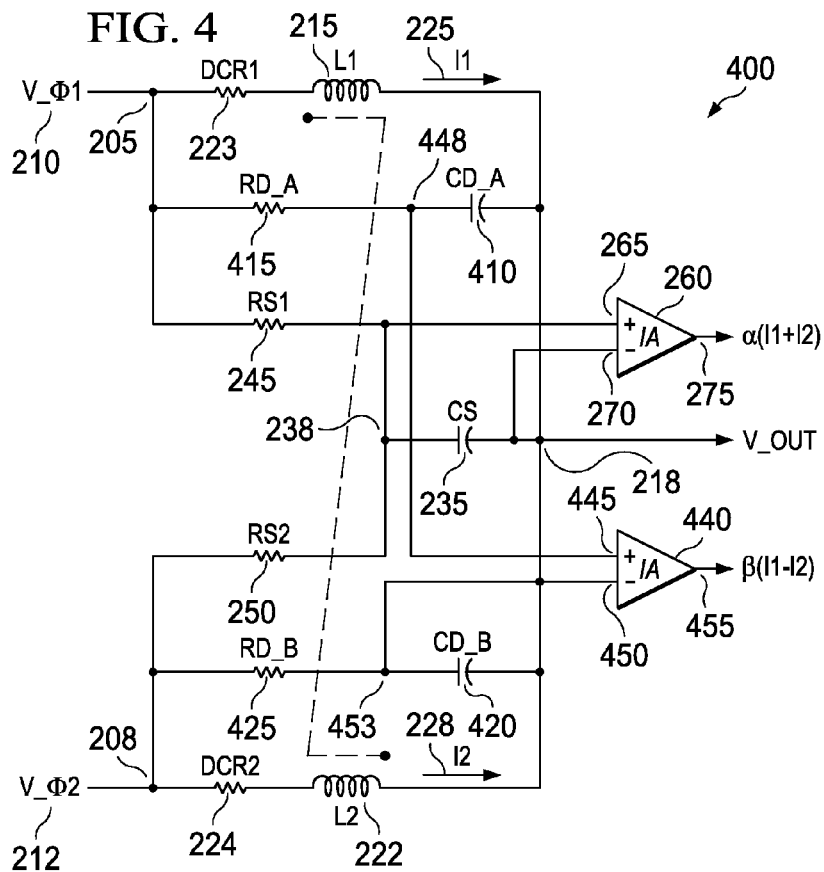
FIG. 4 is a schematic diagram of a coupled inductor current sensing apparatus according to various example embodiments.

FIG. 4 is a schematic diagram of a coupled inductor current sensing apparatus 400 according to various example embodiments. The apparatus 400 includes the two switched voltage input terminals 205 and 208, the switched drive phases 210 and 212, the output terminal 218, the inductors L1 215 and L2 222, the inductor currents I1 225 and I2 228, the current sum sense capacitor 235, the summing node 238, the current sum sense resistors RS1 245 and RS2 250 and the current sum amplifier 260, all as previously described with reference to the apparatus 200 of FIG. 2.

The apparatus 400 also includes a first current difference sense capacitor CD_A 410 and a first current difference sense resistor RD_A 415 coupled in series. The series combination of the capacitor 410 and the resistor 415 is coupled in parallel with a first inductor L1 215 of the two mutually coupled inductors 215 and L2 222 between the first switched voltage input terminal 205 and the apparatus output terminal 218. A first sense voltage proportional to the instantaneous current flowing through the first inductor 215 is developed across the first current difference sense capacitor 410.

The apparatus 400 further includes a second current difference sense capacitor CD_B 420 and a second current difference sense resistor RD_B 425 coupled in series. The series combination of the capacitor 420 and the resistor 425 is coupled in parallel with the second inductor L2 222 between the second switched voltage input terminal 208 and the apparatus output terminal 218. A second sense voltage proportional to the instantaneous current flowing through the second inductor 215 is developed across the second current difference sense capacitor 420.

The apparatus 400 also includes a current difference amplifier 440. A non-inverting input terminal 445 of the current difference amplifier 440 is coupled to a junction 448 of the first current difference sense resistor 415 and the first current difference sense capacitor 410. An inverting input terminal 450 of the current difference amplifier 440 is coupled to a junction 453 of the second current difference sense resistor 425 and the second current difference sense capacitor 420. The current difference amplifier 440 senses an instantaneous voltage difference between the first and second sense voltages across the current difference sense capacitors 410 and 420. The amplifier 440 generates a difference signal β(I1−I2) at an output 455 of the amplifier 440. The difference signal β(I1−I2) is proportional to the instantaneous voltage difference between the first and second sense voltages.

$$\beta(I1-I2) = DCR^*(I1-I2)^*(\text{difference amp gain})$$

Figure 5:
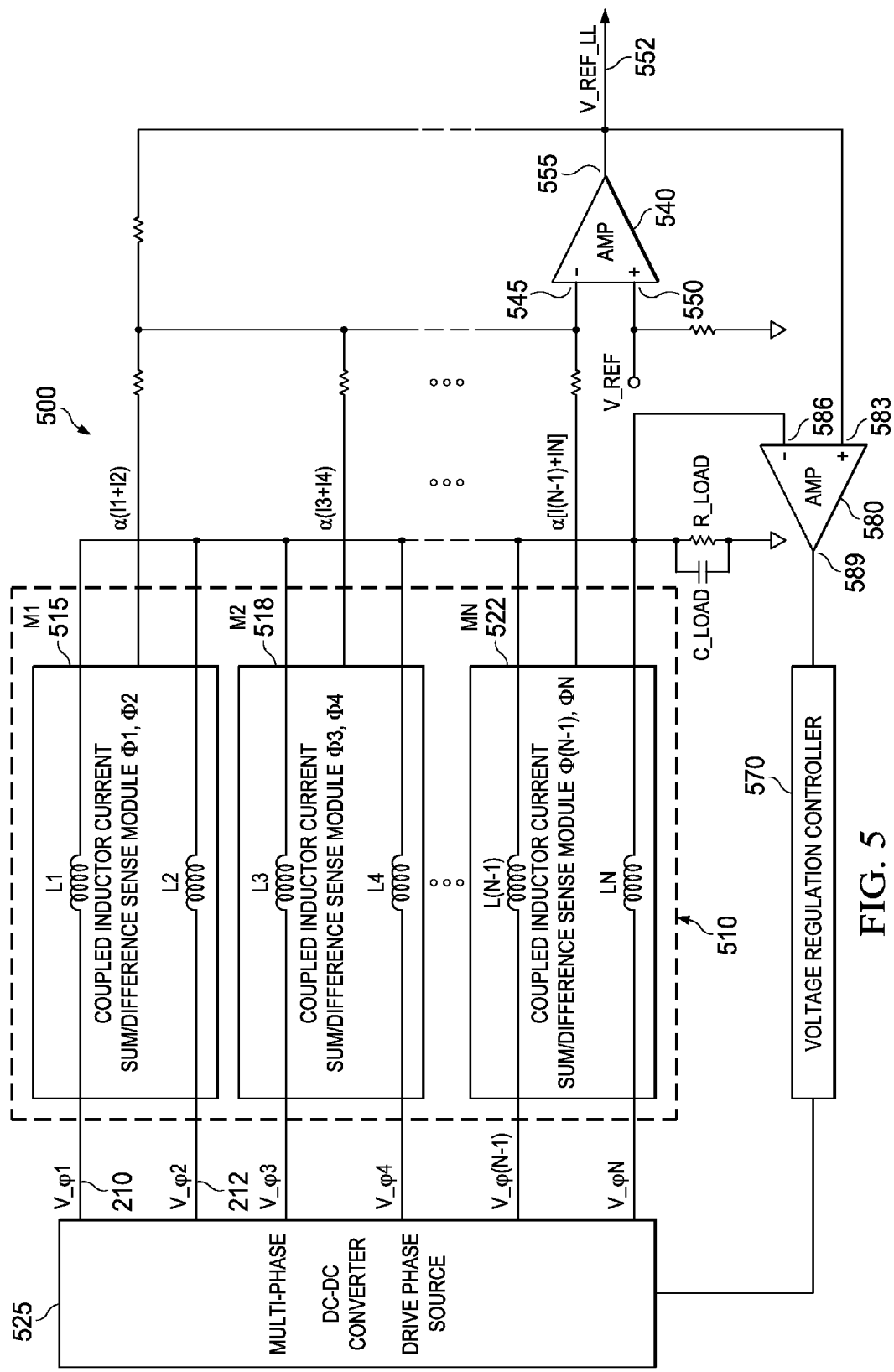
FIG. 5 is a schematic diagram of a multiphase coupled inductor current sensed power converter according to various example embodiments.

FIG. 5 is a schematic diagram of a multiphase coupled inductor current sensed power converter 500 according to various example embodiments. The power converter 500 includes an array 510 of two or more coupled inductor current sum/difference sense modules (e.g., the modules M1 515, M2 518 . . . MN 522). Each sum/difference sense module includes the circuit elements coupled together as previously described in the context of the apparatus 200, the apparatus 300 or the apparatus 400 of FIG. 2, FIG. 3, and FIG. 4, respectively.

Each sum/difference current sense module receives two switched drive phases (e.g., the drive phases 210 and 212 associated with the module 515). Each sum/difference sense module generates a sense module sum signal (e.g., the sum signal α(I1+I2) from the module 515), a sense module difference signal (e.g., a difference signal β(I1−I2) from the module 515, not shown), or both. A module sum signal is proportional to an instantaneous sum of currents flowing through two mutually coupled inductors associated with the corresponding current sense module as previously described in the context of the apparatus 200. A module difference signal is proportional to an instantaneous magnitude difference between the currents flowing through the two mutually coupled inductors associated with the corresponding current sense module as previously described in the context of the apparatus 300 of FIG. 3 and the apparatus 400 of FIG. 4.

The power converter 500 also includes a multiphase DC-to-DC power converter drive phase voltage source 525. The drive phase voltage source 525 is coupled to the array 510 of coupled inductor current sum/difference sense modules and generates the two drive phases associated with each sense module.

The power converter 500 further includes a summing device (e.g., the summing configured operational amplifier 540) coupled to the array 510 of sense modules. The summing device receives the sense module sum or difference signals from each of the plurality of sense modules at a first summing device input terminal 545. The summing device also receives a reference signal (e.g., the voltage regulation signal V_REF) at a second summing device input terminal 550. The summing device compares a sum of the sum or difference signals summed to the input terminal 545 to a magnitude of the reference signal at the input terminal 550. The summing device generates a drive phase feedback signal (e.g., the load-line voltage regulation reference signal V_REF_LL 552) at an output terminal 555 of the summing device 540. The drive phase feedback signal is responsive to the comparison of the signals received at the first and second summing device input terminals 545 and 550.

The multiphase coupled inductor current sensed power converter 500 also includes a drive phase controller 570 communicatively coupled to the summing device 540. The drive phase controller 570 receives the drive phase feedback signal and generates one or more drive phase source control signals. For the example power converter 500 of FIG. 5, the drive phase controller 570 is a voltage regulation controller.

In the example embodiment of the multiphase coupled inductor current sensed power converter 500 being a load-line regulator, the reference signal is a base reference voltage V_REF. The summing device 540 is an operational amplifier configured in a summing mode to receive V_REF and to generate the load-line voltage reference signal V_REF_LL 552 as the drive phase feedback signal. V_REF_LL 552 is used to maintain an output voltage level of the multiphase DC-to-DC converter as load current from the DC-to-DC converter changes.

The load-line embodiment also includes an amplifier 580. The al amplifier 580 is input-coupled to the operational amplifier to receive V_REF_LL 552 at a first input terminal 583 of the amplifier 580. The amplifier 580 receives a converter output voltage sample at a second input terminal 586 of the amplifier 580. The amplifier 580 generates a converter output voltage feedback signal at an output terminal 589 of the amplifier 580.

The voltage regulation controller is coupled to the output terminal of the amplifier 580 to receive the converter output voltage feedback signal. The voltage regulation controller generates one or more drive phase duty cycle control signals and/or one or more drive phase amplitude control signals responsive to the converter output voltage feedback signal. The drive phase source 525 is coupled to the voltage regulation controller to receive the drive phase control signals. The drive phase source 525 modifies the duty cycle and/or amplitude of one or more drive phases responsive to the drive phase control signals in order to maintain the converter output voltage within established regulation specifications.

Figure 6:
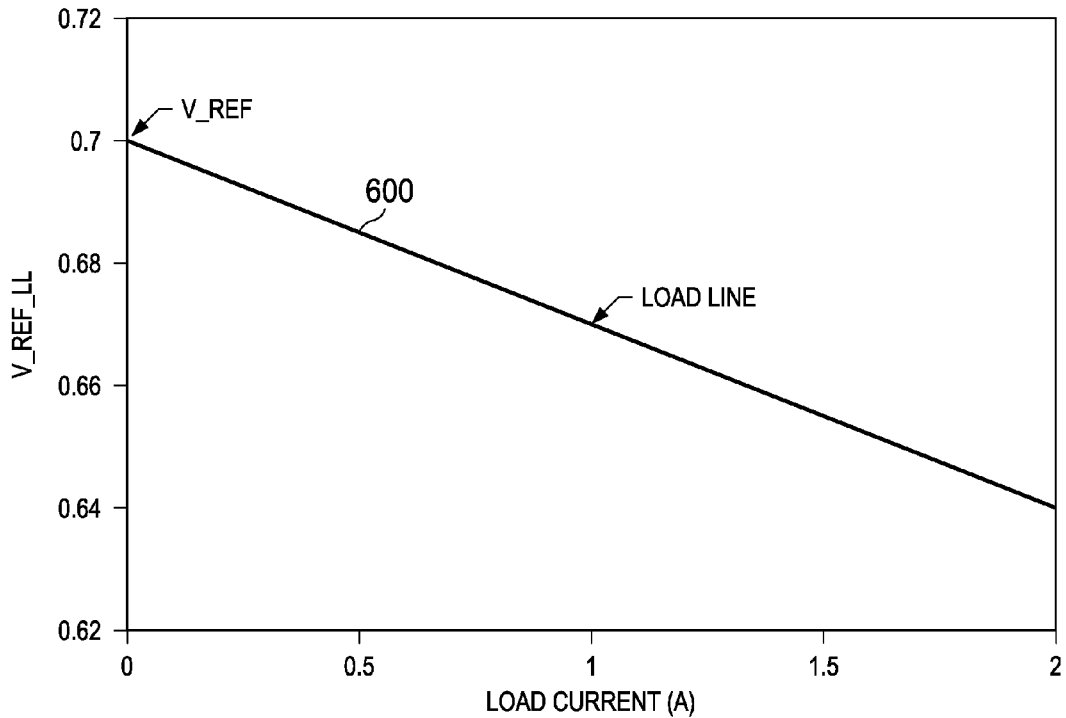
FIG. 6 is a waveform diagram illustrating a load line curve associated with a load-line embodiment of a multiphase coupled inductor current sensed power converter.

FIG. 6 is a waveform diagram illustrating a load-line curve 600 associated with the load-line embodiment of the multiphase coupled inductor current sensed power converter

500 of FIG. 5. The load-line curve 600 illustrates V_REF_LL 552 of FIG. 5 as a function of the sum of the load currents flowing through the inductors of the sense module array 510 as sensed at the input 545 of the operational amplifier 540.

Figure 7:
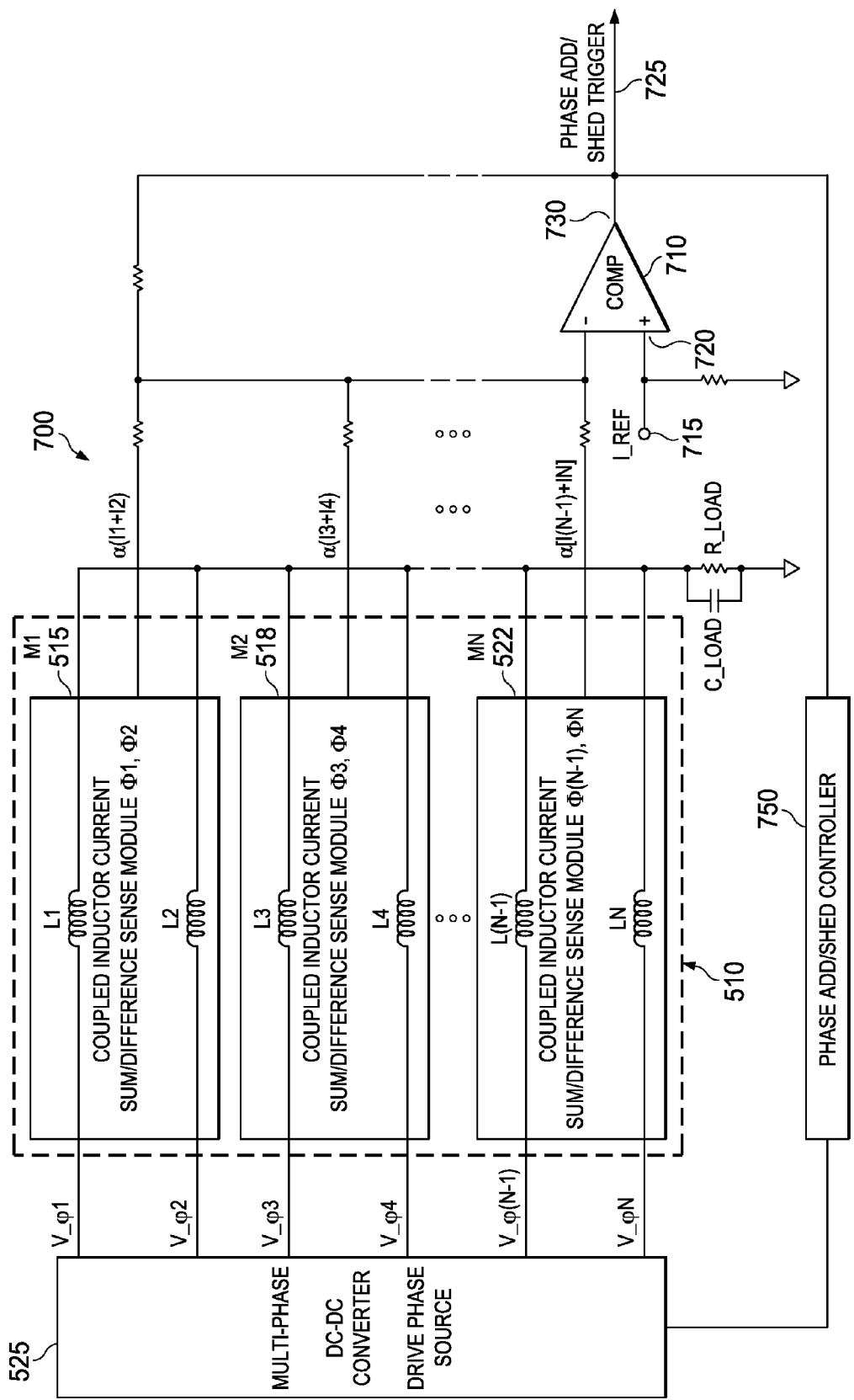
FIG. 7 is a schematic diagram of a phase add/shed embodiment of a multiphase coupled inductor current sensed power converter.

FIG. 7 is a schematic diagram of a phase add/shed embodiment of a multiphase coupled inductor current sensed power converter 700. The power converter 700 includes the array 510 of current sense modules 515, 518 . . . 522 and the multiphase drive phase source 525 as previously described in the context of the power converter 500 of FIG. 5.

The power converter 700 also includes a signal comparator 710 coupled to the sense module array 510. The comparator 710 receives a total phase current reference signal I_REF 715 at a comparator input 720. The comparator 710 also receives and sums the sense module sum signals received from each sense module at a comparator input 725. The sum of the sense module sum signals represents total instantaneous current flowing through all inductors. The comparator 710 compares the sum of the sense module sum signals to I_REF. The comparator 710 generates a drive phase add/shed trigger signal 725 at the comparator output 730 when the total instantaneous current flowing through all inductors crosses a threshold represented by I_REF.

The power converter 700 also includes a drive phase add/shed controller 750. The add/shed controller 750 receives the add/shed trigger signal 725 as a drive phase feedback signal. The add/shed controller 750 generates add/shed control signals to cause the drive phase source 525 to selectively enable and disable drive phases associated with one or more sense modules in response to converter output load demand.

It is noted that the load-line regulation embodiment of the power converter 500 and the phase shedding/adding embodiment of the power converter 700 are example systems utilizing multi-module embodiments of coupled inductor current sensing apparatus described above. Both the load-line regulation system embodiment and the phase shedding/adding embodiment utilize sense module sum signals. Other system embodiments including intra-module current balancing systems utilize sense module difference signals. For example, a comparator associated with each sense module of an example multi-module system receives a sense module difference signal from the associated sense module. The difference signal is phase-compared to a reference phase to control the on time of drive phases associated with each sense module. Some systems including DC power converters may include multiple application embodiments such as load-line regulation in combination with phase shedding/adding.

Apparatus and systems described herein may be useful in applications other than multiphase DC-DC converters. The examples of the apparatus 200, 300 and 400 and the power converters 500 and 700 described herein are intended to provide a general understanding of the structures of various embodiments. They are not intended to serve as complete descriptions of all elements and features of systems and methods that might make use of these example structures.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Accordingly, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A coupled inductor current sensing apparatus, comprising:
    a current sum sense capacitor coupled between a summing node and an output terminal, a sum sense voltage across the current sum sense capacitor being proportional to an instantaneous sum of magnitudes of currents flowing through first and second two mutually coupled inductors, the first mutually coupled inductor being coupled between the output terminal and a first switched voltage input terminal to receive a corresponding first switched drive voltage ("first drive phase") from a multiphase voltage source, and the second mutually coupled inductor being coupled between the output terminal and a second switched voltage input terminal to receive a corresponding second switched drive voltage ("second drive phase") from the multiphase voltage source;
    a first current sum sense resistor coupled between the first switched voltage input terminal and the summing node; and
    a second current sum sense resistor coupled between the second switched voltage input terminal and the summing node.

2. The coupled inductor current sensing apparatus of claim 1, the multiphase voltage source being associated with a direct current ("DC")-to-DC power converter.

3. The coupled inductor current sensing apparatus of claim 1, a phase difference between the first and second drive phases being 180 degrees.

4. The coupled inductor current sensing apparatus of claim 1, further comprising:

a current sum amplifier; having non-inverting and inverting input terminals coupled across the current sum sense capacitor, the current sum amplifier to sense the sum sense voltage and to generate a sum signal proportional to the sum sense voltage at a current sum amplifier output terminal, the sum signal being proportional to the instantaneous sum of the magnitudes of currents flowing through the first and second mutually coupled inductors.

5. The coupled inductor current sensing apparatus of claim 4, the current sum amplifier selected from a group consisting of an operational amplifier, a transconductance amplifier, and a sense amplifier.

6. The coupled inductor current sensing apparatus of claim 1, further comprising:
a current difference sense capacitor across which a difference sense voltage proportional to an instantaneous difference between magnitudes of the currents through the first and second mutually coupled inductors is to be sensed; and
a current difference sense resistor coupled in series with the current difference sense capacitor to form a current difference resistor-capacitor ("RC") network, the current difference RC network being coupled between the first and second switched voltage input terminals, the difference sense voltage resulting from a voltage drop across the current difference sense resistor corresponding to a charging current flowing through the current difference sense resistor as the first and second drive phases are switched.

7. The coupled inductor current sensing apparatus of claim 6, further comprising:
a current difference amplifier having non-inverting and inverting input terminals coupled across the current difference sense capacitor, the current difference amplifier to sense the current difference sense voltage and to generate a difference signal proportional to the instantaneous difference between the magnitudes of the currents through the first and second mutually coupled inductors at a current difference amplifier output terminal.

8. A coupled inductor current sensing apparatus, comprising:
a current sum sense capacitor coupled between a summing node and an output terminal, a sum sense voltage across the current sum sense capacitor being proportional to an instantaneous sum of magnitudes of currents flowing through first and second mutually coupled inductors, the first mutually coupled inductor being coupled between the output terminal and a first an associated switched voltage input terminal to receive a corresponding first switched drive voltage ("first drive phase") from a multiphase voltage source, and the second mutually coupled inductor being coupled between the output terminal and a second switched voltage input terminal to receive a corresponding second switched drive voltage ("second drive phase") from the multiphase voltage source;
a first current sum sense resistor coupled between the first switched voltage input terminal and the summing node;
a second current sum sense resistor coupled between the second switched voltage input terminal and the summing node;
a first current difference sense capacitor across which a first sense voltage proportional to an instantaneous current flowing through a first one of the first two mutually coupled inductor is to be sensed;
a first current difference sense resistor coupled in series with the first current difference sense capacitor, the series combination of the first current difference sense resistor and the first current difference sense capacitor being coupled in parallel with the first mutually coupled inductor between the first switched voltage input terminal and the output terminal;
a second current difference sense capacitor across which a second sense voltage proportional to an instantaneous current flowing through the second mutually coupled inductor is to be sensed;
a second current difference sense resistor coupled in series with the second current difference sense capacitor, the series combination of the second current difference sense resistor and the second current difference sense capacitor being coupled in parallel with the second mutually coupled inductor between the second switched voltage input terminal and the output terminal; and
a current difference amplifier having: a non-inverting input terminal coupled to a junction of the first current difference sense resistor and the first current difference sense capacitor; and an inverting input terminal coupled to a junction of the second current difference sense resistor and the second current difference sense capacitor; the current difference amplifier to sense an instantaneous voltage difference between the first and second sense voltages and to generate a difference signal proportional to the instantaneous voltage difference at an output terminal of the current difference amplifier.

9. The coupled inductor current sensing apparatus of claim 8, further comprising:
a current sum amplifier having non-inverting and inverting input terminals coupled across the current sum sense capacitor, the current sum amplifier to sense the sum sense voltage and to generate a sum signal proportional to the sum sense voltage at a current sum amplifier output terminal, the sum signal being proportional to the instantaneous sum of the magnitudes of currents flowing through the first and second mutually coupled inductors.

10. A multiphase coupled inductor current sensed power converter, comprising:
a plurality of coupled inductor current sum and difference sense modules ("sense modules"), each sense module to receive two switched drive voltage signals ("drive phases") and to output at least one of: a sense module sum signal proportional to an instantaneous sum of currents flowing through two mutually coupled inductors associated with the sense module; or a sense module difference signal proportional to an instantaneous magnitude difference between the currents flowing through the two mutually coupled inductors;
a multiphase direct current ("DC")-to-DC power converter phase voltage source coupled to the sense modules to generate the two drive phases associated with each sense module; and
a summing device coupled to the sense modules to receive the sense module sum or difference signals from each of the sense modules at a first summing device input terminal, to receive a reference signal at a second summing device input terminal, to compare a sum of the sum or difference signals to a magnitude of the reference signal, and to output a drive phase feedback signal responsive to the comparison of the signals received at the first and second summing device input terminals.

11. The multiphase coupled inductor current sensed power converter of claim 10, further comprising:
a drive phase controller communicatively coupled to the summing device to receive the drive phase feedback signal and to generate at least one drive phase source control signal.

12. The multiphase coupled inductor current sensed power converter of claim 11, the drive phase controller being a voltage regulation controller to generate at least one of: a drive phase duty cycle control signal; or a drive phase amplitude control signal.

13. The multiphase coupled inductor current sensed power converter of claim 12, the reference signal being a base reference voltage ("V_REF").

14. The multiphase coupled inductor current sensed power converter of claim 13, the summing device being an operational amplifier configured in a summing mode to receive V_REF and to generate a load-line voltage reference signal ("V_REF_LL") as the drive phase feedback signal, V_REF_LL being used to maintain an output voltage level of the multiphase DC-to-DC converter as load current from the DC-to-DC converter changes.

15. The multiphase coupled inductor current sensed power converter of claim 14, further comprising:
an amplifier input-coupled to the operational amplifier to receive V_REF_LL at a first amplifier input terminal, to receive a converter output voltage sample at a second amplifier input terminal, and to generate an output voltage feedback signal at an output terminal of the amplifier, the output terminal of the amplifier being coupled to the voltage regulation controller.

16. The multiphase coupled inductor current sensed power converter of claim 11, the drive phase controller being a drive phase add/shed controller to selectively enable and disable drive phases associated with at least one sense module in response to converter output load demand.

17. The multiphase coupled inductor current sensed power converter of claim 16, the reference signal being a phase current reference signal ("I_REF").

18. The multiphase coupled inductor current sensed power converter of claim 17, the summing device being a signal comparator to receive I_REF and the sense module sum signals from each sense module, to compare the sum of the sense module sum signals representing total instantaneous current flowing through all inductors to I_REF, and to generate a drive phase add/shed trigger signal as the drive phase feedback signal when the total instantaneous current flowing through all inductors crosses a threshold represented by I_REF.

19. The multiphase coupled inductor current sensed power converter of claim 10, each of the sense modules further comprising:
a current sum sense capacitor coupled between a summing node and an output terminal, a sum sense voltage across the current sum sense capacitor being proportional to an instantaneous sum of magnitudes of currents flowing through first and second mutually coupled inductors, the first mutually coupled inductor being coupled between the output terminal and a first switched voltage input terminal to receive a corresponding first switched drive voltage ("first drive phase") from a multiphase voltage source, and the second mutually coupled inductor being coupled between the output terminal and a second switched voltage input terminal to receive a corresponding second switched drive voltage ("second drive phase") from the multiphase voltage source;
a first current sum sense resistor coupled between the first switched voltage input terminal and the summing node;
a second current sum sense resistor coupled between the second switched voltage input terminal and the summing node;
a current sum amplifier having non-inverting and inverting input terminals coupled across the current sum sense capacitor, the current sum amplifier to sense the sum sense voltage and to generate a sum signal proportional to the sum sense voltage at a current sum amplifier output terminal, the sum signal being proportional to the instantaneous sum of the magnitudes of currents flowing through the first and second mutually coupled inductors;
a first current difference sense capacitor across which a first sense voltage proportional to an instantaneous current flowing through the first mutually coupled inductor is to be sensed;
a first current difference sense resistor coupled in series with the first current difference sense capacitor, the series combination of the first current difference sense resistor and the first current difference sense capacitor being coupled in parallel with the first mutually coupled inductor between the first switched voltage input terminal and the output terminal;
a second current difference sense capacitor across which a second sense voltage proportional to an instantaneous current flowing through the second mutually coupled inductor is to be sensed;
a second current difference sense resistor coupled in series with the second current difference sense capacitor, the series combination of the second current difference sense resistor and the second current difference sense capacitor being coupled in parallel with the second mutually coupled inductor between the second switched voltage input terminal and the output terminal; and
a current difference amplifier having: a non-inverting input terminal of the current difference amplifier coupled to a junction of the first current difference sense resistor and the first current difference sense capacitor; and an inverting input terminal coupled to a junction of the second current difference sense resistor and the second current difference sense capacitor; the current difference amplifier to sense an instantaneous voltage difference between the first and second sense voltages and to generate a difference signal proportional to the instantaneous voltage difference at an output terminal of the current difference amplifier.

* * * * *